United States Patent
Dirks et al.

(10) Patent No.: US 7,634,748 B2
(45) Date of Patent: Dec. 15, 2009

(54) SPECIAL ENGINEERING CHANGE ORDER CELLS

(75) Inventors: Juergen Dirks, Holzkirchen (DE);
Matthias Dinter, Holzkirchen (DE);
Johann Leyrer, Munich (DE)

(73) Assignee: LSI Corporation, Milpitas, CA (US)

( * ) Notice: Subject to any disclaimer, the term of this patent is extended or adjusted under 35 U.S.C. 154(b) by 366 days.

(21) Appl. No.: 10/897,655

(22) Filed: Jul. 22, 2004

(65) Prior Publication Data
US 2006/0031798 A1 Feb. 9, 2006

(51) Int. Cl.
G06F 17/50 (2006.01)
G06F 9/45 (2006.01)
H03K 17/693 (2006.01)

(52) U.S. Cl. .................. 716/5; 716/2; 716/13; 716/14; 716/16

(58) Field of Classification Search ................ 716/4–6, 716/2, 16, 13, 14
See application file for complete search history.

(56) References Cited

U.S. PATENT DOCUMENTS

| | | | | |
|---|---|---|---|---|
| 6,184,711 | B1 * | 2/2001 | Graef et al. | 326/41 |
| 2002/0162086 | A1 * | 10/2002 | Morgan | 716/18 |
| 2004/0199879 | A1 * | 10/2004 | Bradfield et al. | 716/1 |
| 2006/0031796 | A1 * | 2/2006 | Meaney | 716/6 |

* cited by examiner

Primary Examiner—Phallaka Kik
Assistant Examiner—Suresh Memula
(74) Attorney, Agent, or Firm—Christopher P. Maiorana, PC (57) ABSTRACT

A method for correcting a plurality of violations in a circuit design and new cells used in the method are disclosed. The method generally includes the steps of (A) implementing a first engineering change order in the circuit design to correct a first of the violations, (B) implementing a second engineering change order with a special cell to correct a second of the violations, the special cell having a plurality of interfaces available for a signal path associated with the second violation, each of the interfaces having a characteristic appropriate to correct the second violation, each of the characteristics having a different performance and (C) routing the signal path to one of the interfaces to fix the second violation.

20 Claims, 6 Drawing Sheets

SPECIAL ENGINEERING CHANGE ORDER CELLS

FIELD OF THE INVENTION

The present invention relates to application specific integrated circuit development generally and, more particularly, to special engineering change order cells.

BACKGROUND OF THE INVENTION

In application specific integrated circuit (ASIC) and rapid circuit design flows, a high number of engineering change orders (ECOs) (i.e., changes to a netlist, inserting buffers and resizing buffers) are commonly used to fix timing or signal integrity related problems close to an end of the design flow. As the implementation of each ECO can easily take up to several days, the high number of ECOs makes accurate project scheduling difficult and therefore unacceptable. A problem in generating the ECOs is that different conventional tools used to do the job do not correlate well to each other. The inaccuracies in correlation often result in a second iteration to the ECOs as the first ECOs do not solve the addressed issue completely. As cell sizes, and therefore cell locations, can change dramatically between the two iterations of the ECOs, results are hard to predict and often leave timing or signal integrity violations unresolved. Also, since cells are displaced relative to each iteration, an effort to reroute the connected signals is very high and can create unforeseen congestion.

A conventional approach for dealing with a large number of ECOs is to be pessimistic and add more margin than necessary to the ECO calculations. However, adding more margin to ECO calculations can lead to congestion problems as too many new cells would be inserted into the design. Severe congestion can make the design layout unroutable. In addition, the iteration solution does not guarantee that timing and signal integrity violations will really be fixed. Adding more cells to the design can cause even more displacement of the existing cells and therefore generate new problems.

Another conventional approach is to accept a schedule delay and run several ECOs in a row until all violations are fixed. The conventional solution to run several ECOs in a row is unacceptable because of the long tool runtimes for each of the ECOs. In addition, new routing introduced by each sequential ECO can cause problems at the very end of the design flow, further complicating project scheduling.

SUMMARY OF THE INVENTION

The present invention concerns a method for correcting a plurality of violations in a circuit design and new cells used in the method. The method generally comprises the steps of (A) implementing a first-engineering change order in the circuit design to correct a first of the violations, (B) implementing a second engineering change order with a special cell to correct a second of the violations, the special cell generally comprises a plurality of interfaces available for a signal path associated with the second violation, each of the interfaces having a characteristic appropriate to correct the second violation, each of the characteristics having a different performance and (C) routing the signal path to one of the interfaces to fix the second violation.

The objects, features and advantages of the present invention include providing a special engineering change order cell and method of implementing that may (i) prevent automatic cell relocation due to changes that correct a circuit design violation, (ii) allow for performance changes through minor routing adjustments, (iii) minimize an impact on signal timing in other nets in the circuit design, (iv) minimize an impact on signal integrity in other nets in the circuit design and/or (v) minimize a number of new violations created by implementing an engineering change order.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

In multi-million gate chip designs, turn around times during design closure are generally very long. Reducing a number of loops or iterations to adjust a circuit design may significantly shorten a schedule. The present invention concerns a new set of library circuit (or cells) that may be used to fix timing and/or signal integrity violations encountered while completing the circuit design. The new set of cells may be useful in an engineering change order (ECO) phase of a design. During the ECO phase, a netlist for the circuit design may only be changed a little to fix signal timing and/or signals integrity violations.

The new cells may be functionally similar to corresponding standard cells and generally provide a wider choice of input and/or output pins and capabilities. Each pin is generally configured to provide a different performance characteristic than neighboring pins. The different performance characteristics may include, but are not limited to, different insertion delays, propagation delays, drive strengths, ramp up times, ramp down times and the like.

Figure 1:
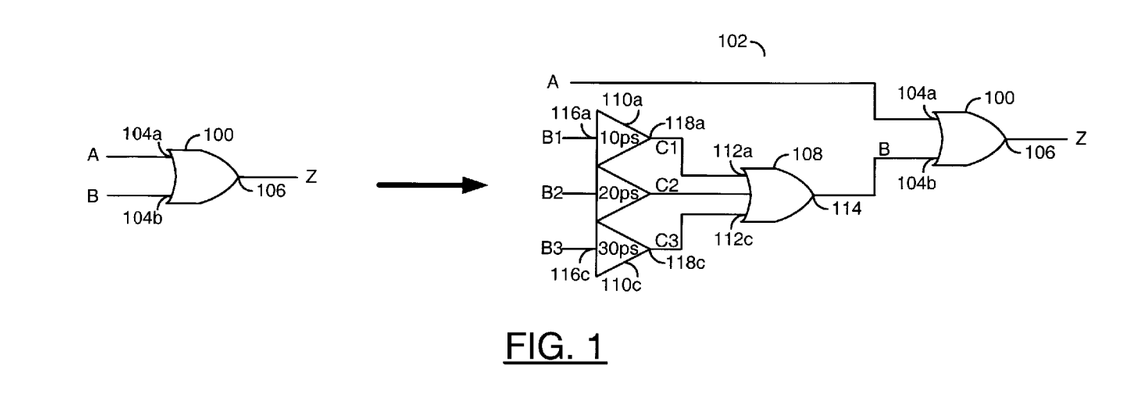
FIG. 1 is a schematic illustrating a standard circuit and a new circuit in accordance with a preferred embodiment of the present invention.

Referring to FIG. 1, a schematic illustrating a standard circuit (or apparatus) 100 and a new circuit (or apparatus) 102 is shown in accordance with a preferred embodiment of the present invention. The new circuit 102 may be used in place of the standard circuit 100 to implement an ECO for correcting a timing violation in a circuit design. In particular, each circuit 100 and 102 may be designed to fix a hold time violation.

The standard circuit 100 may be referred to as a standard cell. The standard cell 100 may be implemented as one or more logic gates. The standard cell 100 may have one or more inputs 104a-104b to receive one or more input signals (e.g., A and B). The standard cell 100 may operate on the input signals A and B to generate an output signal (e.g., Z). The output signal Z may be presented at an output 106 of the standard cell 100. The operation may be configured as a logical operation or transfer function (e.g., a two-input OR function). The operation may have a timing characteristic. For example, the standard cell 100 may have a propagation or transfer delay between a change in the input signals A and/or B and an associated change in the output signal Z.

The new circuit 102 may be referred to as a new cell. The new cell 102 may be implemented as multiple logic gates. The new cell 102 generally comprises the standard cell 100, a first circuit 108 and multiple second circuits 110a-110c The new cell 102 may receive the input signal A and multiple input signals (e.g., B1, B2 and B3). The new cell 102 may generate the output signal Z.

The first circuit 108 may be implemented as a logic gate (e.g., a three-input OR gate). The logic gate 108 may have multiple inputs 112a-112c to receive multiple input signals (e.g., C1, C2 and C3). An output 114 of the logic gate 108 may be directly connected to one of the inputs 104a or 104b (shown) of the standard cell 100. The logic gate 108 may have a transfer function or operation that generates the signal B in response to the input signals C1, C2 and C3. A timing characteristic (e.g., a propagation delay or a transfer delay) may be associated with the operation of the logic gate 108.

Each of the second circuits 110a-110c may be implemented as a logic gate (e.g., a non-inverting buffer). Each of the logic gates 110a-110c may have an input 116a-116c to receive an input signal (e.g., B1, B2 and B3). An output 118a-118c of each logic gate 110a-110c may be directly connected to a respective input 112a-112c of the logic gate 108. The logic gates 110a-110c may be operational to generate the signals C1, C2 and C3 in response to the input signals B1, B2 and B3, respectively. An operation or transfer function of each logic gate 110a-110c may have an associated timing characteristic (e.g., a propagation delay or a transfer delay).

A performance for each timing characteristic of the logic gates 110a-110c may be unique among the logic gates 110a-110c. Generally, the performance of each logic gate 110a-110c may be slightly different than the performance of the surrounding logic gates 110a-110c. An offset or delta between the performances of the upper logic gate 110a and the middle logic gate 110b may be similar to an offset or delta between the performances of the middle logic gate 110b and the lower logic gate 110c. For example, a timing characteristic of the first logic gate 110a may have an insertion delay of 10 picoseconds (ps). A timing characteristic of the second logic gate 110b may have an insertion delay of 20 ps. A timing characteristic of the third logic gate 110c may have an insertion delay of 30 ps. Other types of characteristics, other performances of the characteristics and other numbers of the inputs may be implemented to meet the criteria of a particular application.

Figure 2:
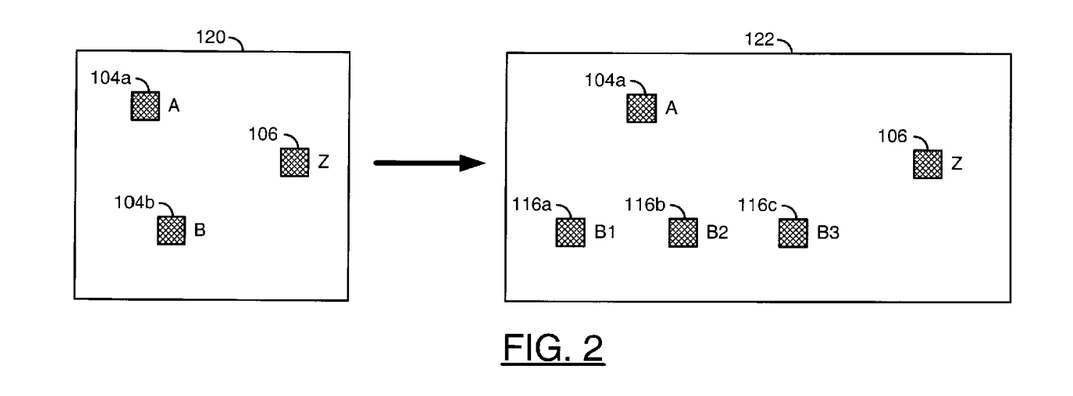
FIG. 2 is a layout diagram illustrating boundary areas of a standard cell and a new cell of FIG. 1.

Referring to FIG. 2, a layout diagram illustrating boundary areas of the standard cell 100 and the new cell 102 is shown. The standard cell 100 may occupy an area 120. The inputs 104a-104b and the output 106 are illustrated within the area 120. The new cell 102 may occupy an area 122. The area 122 may be larger than the area 120 due to the added logic gates 108 and 110a-110c. Locations for the input 104a and the output 106 may be similar in both of the areas 120 and 122. The input 104b in the area 120 may be replaced with the inputs 116a-116c in the area 122. Locations for the inputs 116a-116c may be similar to the location of the input 104b. All of the inputs 116a-116c may be physically proximate each other for ease of routing the input signal B.

The new cell 102 may be operationally similar to the standard cell 100 once implemented in a circuit design. A difference between the standard cell 100 and the new cell 102 generally involves an option for delaying the signal B by one of several possible delays by appropriate routing through one of the inputs 116a-116c. To enable multiple possible delays, the new cell 102 may be implemented with at least two inputs 116a-116c. Generally, an odd number of inputs 116a-116c may be provided. The new cell 102 may be configured such that a "center" input (e.g., 116b) may establish a theoretical insertion delay performance to correct a target timing violation. One or more inputs (e.g., 116a) may be provided with shorter insertion delays than that of the center input 116b to allow for simple adjustments if the center insertion delay is too long. One or more inputs (e.g., 116c) may be provided with longer insertion delays than that of the center input 116b to allow for simple adjustments if the center insertion delay is too short.

Figure 3:
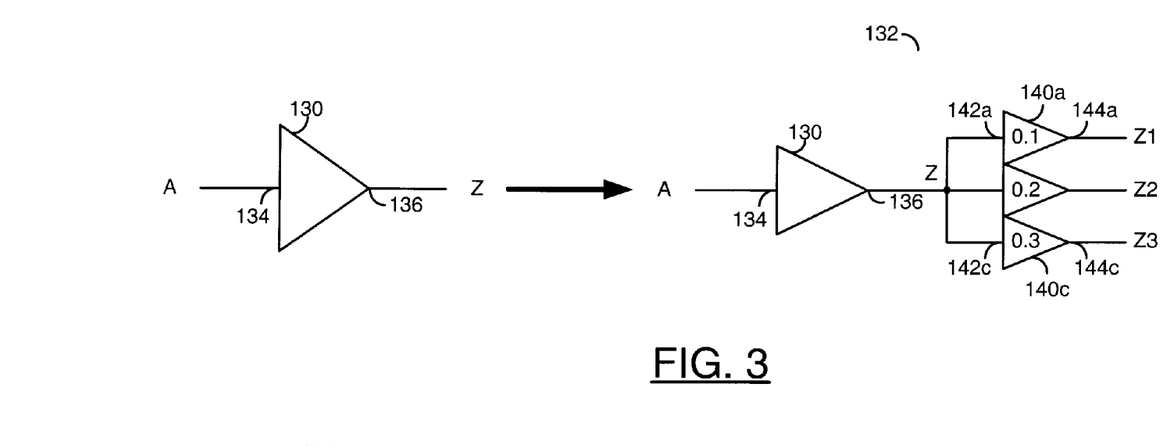
FIG. 3 is a schematic illustrating another standard circuit and another new circuit.

Referring to FIG. 3, a schematic illustrating another standard circuit (or apparatus) 130 and another new circuit (or apparatus) 132 is shown. The new circuit 132 may be used in place of the standard circuit 130 to implement an ECO for correcting a signal integrity violation in a circuit design. In particular, each circuit 130 and 132 may be configured for fixing ramp time violations.

The standard circuit 130 may be referred to as a standard cell. The standard cell 130 may be implemented as one or more logic gates. The standard cell 130 may have at least one input 134 to receive at least the input signal A. The standard cell 130 may operate on the input signal A to generate the output signal Z. The output signal Z may be presented at an output 136 of the standard cell 130. The operation of the standard cell 130 may be configured as a logical operation or transfer function (e.g., a non-inverting buffer function). The operation may have a timing characteristic. For example, the standard cell 130 may have a propagation or transfer delay between a change in the input signal A and an associated change in the output signal Z.

The new circuit 132 may be referred to as a new cell. The new cell 132 may be implemented as multiple logic gates. The new cell 132 generally comprises the standard cell 130 and multiple circuits 140a-140c The new cell 132 may receive the input signal A. The new cell 132 may generate multiple output signals (e.g., Z1, Z2 and Z3).

Each of the circuits 140a-140c may be implemented as a logic gate (e.g., a non-inverting buffer). Each of the logic gates 140a-140c may have an input 142a-142c to receive an input signal (e.g., Z) directly from the output 136 of the standard cell 130. An output 144a-144c of each logic gate 140a-140c may present an output signal (e.g., Z1, Z2 and Z3). The logic gates 140a-140c may be operational to generate the signal Z1, Z2 and Z3 in response to the input signal Z. An operation or transfer function of each logic gate 140a-140c may have an associated signal integrity characteristic (e.g., a drive strength, ramp up time, ramp down time and the like).

A performance for each signal characteristic of the logic gates 140a-140c may be unique among the logic gates 140a-140c. Generally, the performance of each logic gate 140a-140c may be slightly different than the performance of the surrounding logic gates 140a-140c. An offset or delta between the performances of the upper logic gate 140a and the middle logic gate 140b may be similar to an offset or delta between the performances of the middle logic gate 140b and the lower logic gate 140c. For example, a ramp characteristic of the first logic gate 140a may have a rate of 0.1 volt/ps to a standard load. A ramp characteristic of the second logic gate 140b may have a rate of 0.2 volts/ps to the standard load. A timing characteristic of the third logic gate 140c may have a rate of 0.3 volts/ps to the standard load. Other types of characteristics, other performances of the characteristics and other numbers of the outputs may be implemented to meet the criteria of a particular application.

Figure 4:
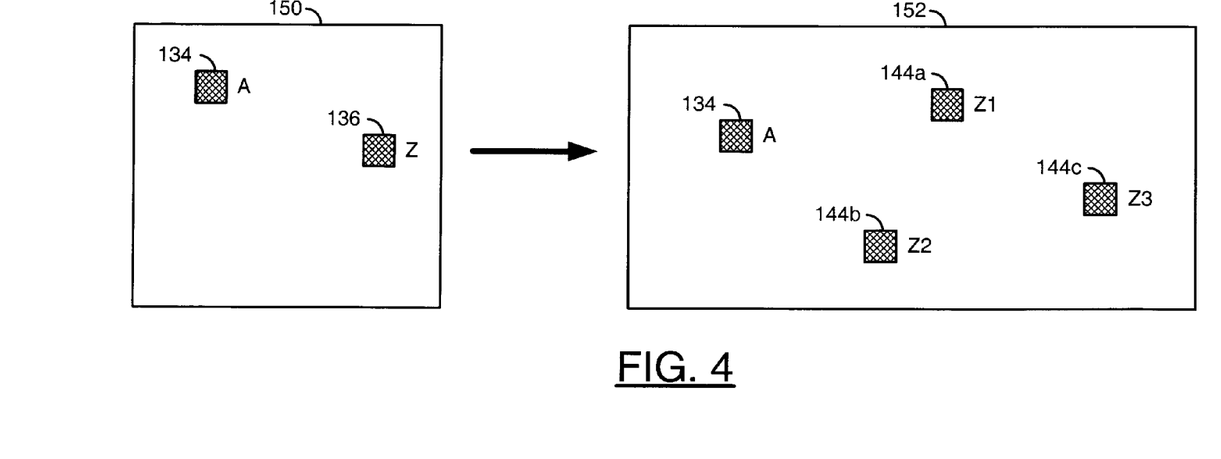
FIG. 4 is a layout diagram illustrating boundary areas of a standard cell and a new cell of FIG. 3.

Referring to FIG. 4, a layout diagram illustrating boundary areas of the standard cell 130 and the new cell 132 is shown. The standard cell 130 may occupy an area 150. The input 134 and the output 136 are also illustrated within the area 150. The new cell 132 may occupy an area 152. The area 152 may be larger than the area 150 due to the added logic gates 140a-140c. Locations for the input 134 may be similar in both of the areas 150 and 152. The output 136 in the area 150 may be replaced with the outputs 144a-144c in the area 152. Locations for the outputs 144a-144c may be similar to the location of the output 136. All of the outputs 144a-144c may be physically proximate each other for ease of connecting to the output signals Z1, Z2 and Z3.

Figure 5:
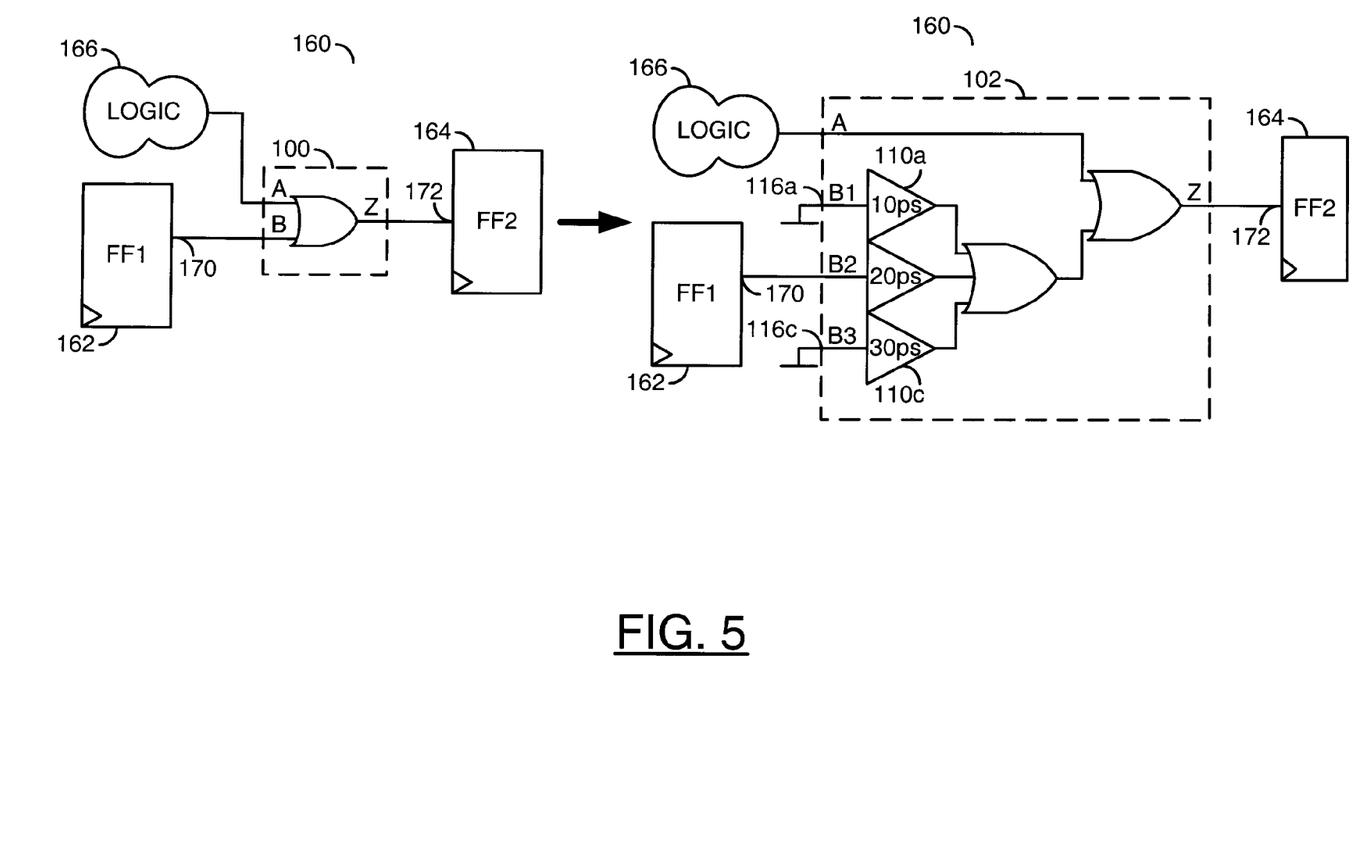
FIG. 5 is a block diagram of an example implementation of a standard cell and a new cell in a circuit design.

Referring to FIG. 5, a block diagram of an example implementation of the standard cell 100 and the new cell 102 in a circuit design 160 is shown. The circuit design 160 may include a first flip-flop 162, a second flip-flop 164, a collection of logic circuits (or blocks) 166 and one of the standard cell 100 or the new cell 102. The standard cell 100 or the new cell 102 may be inserted in a path between an output 170 of the first flip-flop 162 and an input 172 of the second flip-flop 164.

The new cells (e.g., 102 and 132) are generally used in an ECO phase for insertion into netlists in places where violations have been found. A software design tool may determine the new cells from a library of available cells to implement fixes according to the calculated violations. The software design tool may also connect an appropriate interface (e.g., input pin or output pin) among several repeated interfaces. Unused input pins may be tied to a logical one (e.g., power or Vdd) or a logical zero (e.g., ground or Vss) according to the specified functionality. Unused output pins may be left unconnected.

For the example shown in FIG. 5, the input 116b of the new cell 102 may be directly connected to the output 170 of the first flip-flop 162. The unused inputs 116a and 116c may be connected to ground, Vss or logical zero to effectively remove the logic gates 110a and 110c. Looking back from the input 172 of the second flip-flop 164, an implementation of the new cell 102 may appear functionally and physically similar to implementing the standard cell 100.

Figure 6:
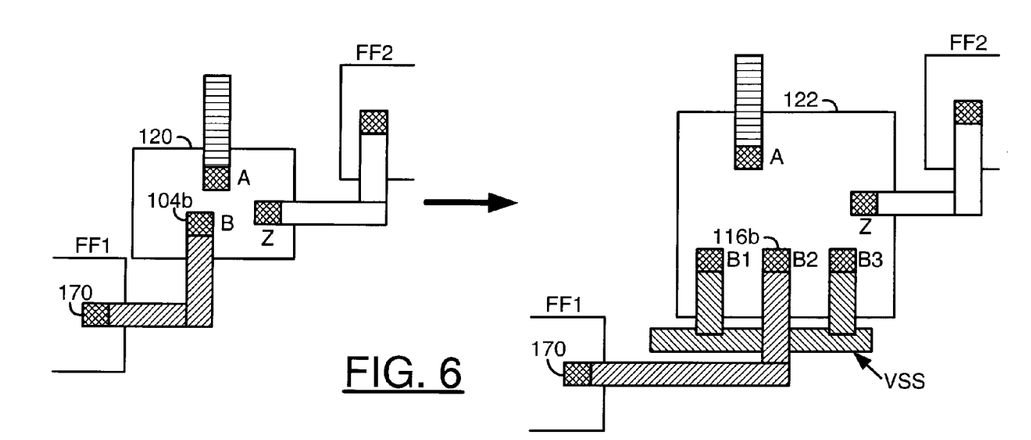
FIG. 6 is a layout diagram for a portion of a circuit design with the routing illustrated in FIG. 5.

Referring to FIG. 6, a layout diagram for a portion of the circuit design 160 with the routing illustrated in FIG. 5 is show. The output 170 of the first flip-flop 162 may be directly connected to the input 104b in the area 120 for the standard cell 100. The output 170 may be directly connected to the input 116b in the area 122 for the new cell 102. The inputs 116a and 116c may be directly connected to Vss (e.g., a logical zero) to permit the output signal Z to respond only to the input signal B2.

Figure 7:
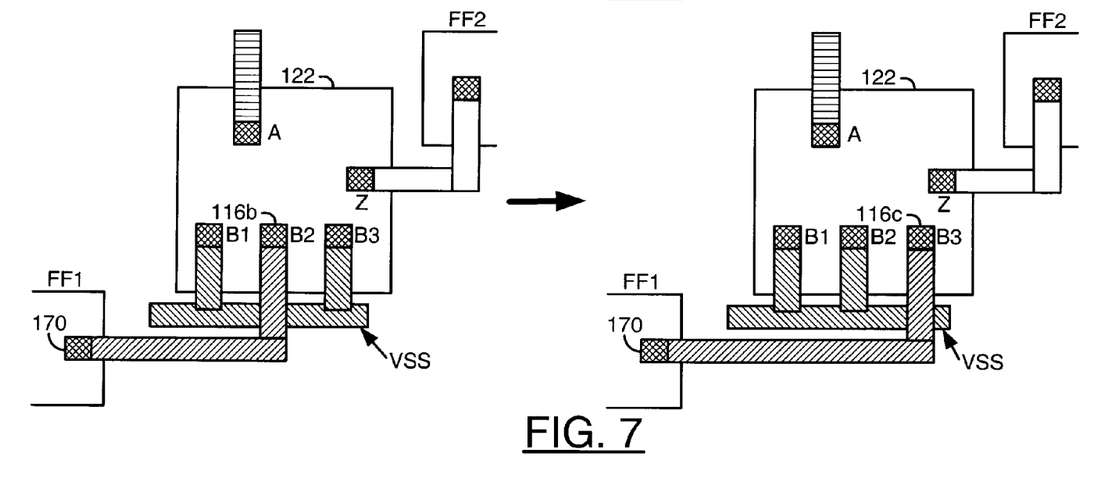
FIG. 7 is a layout diagram for the circuit design utilizing an alternative input to the new cell.

Referring to FIG. 7, a layout diagram for the circuit design 160 utilizing an alternative input to the new cell 102 (area 122) is shown. After the new cell 102 has been implemented, design checking rules for signal timing and signal integrity verification may be run. Since the various tools used for verification generally lack complete correlation between each other, verification may not be 100 percent. Therefore, some new violations may appear around the just inserted new area 122. The new violations may be fixed by reconnecting a net to a different input pin among the repeated versions of the input pins with the same functionality.

For example, if the input 116b of the new cell 102 does not provide a proper performance to correct the target violation, another input 116a or 116c may be implemented as appropriate. Therefore, the output signal at the output 170 of the flip-flop 162 may be rerouted from the input pin 116b (e.g., left side of the figure) to the input pin 116c (e.g., right side of the figure). Since the new cell 102 is not replaced by the rerouting procedure, re-running an automatic layout tool used in placing the new cell 102 may be avoided, leaving the circuit layout basically undisturbed.

For hold time fixes, if the insertion delay value was not high enough, another pin with more insertion delay may be connected to receive the input signal. If the inserted delay was too much (e.g., causing a setup time violation), another pin with less insertion delay may be connected to receive the input signal. For ramp time violations, if the drive strength was not high enough, another pin with a higher drive strength may be connected to an output net. If the drive strength was too high (e.g., causing a signal ramp time being too steep), another pin with a lower drive strength may be connected to the output net. Therefore, change is generally limited to only a small routing change rather than changing cells. Not changing the cells generally avoids not knowing where the cells may end up after legal automatic placement with a potential of causing new violations. For comparison, if a different cell was inserted in place of the new cell 102 to achieve an additional delay, the different cell may be displaced from the location of the original new cell 102 due to limited space. As a result, routing may change dramatically, potentially influencing many other nets and the associated delays.

Figure 8:
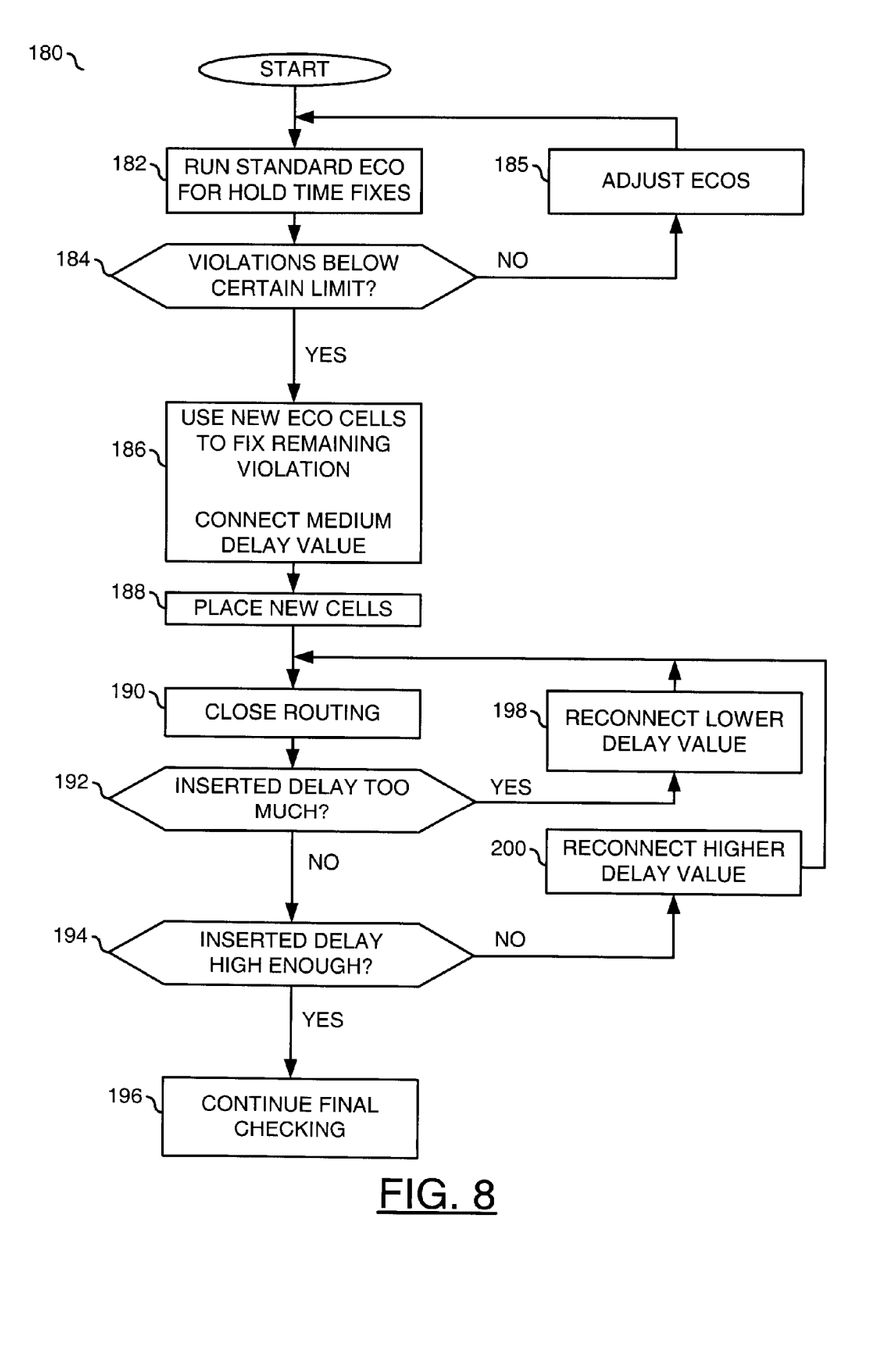
FIG. 8 is a flow diagram for an example method for correcting hold time violations.

Referring to FIG. 8, a flow diagram for an example method 180 for correcting hold time violations is shown. The method 180 generally begins with performing a standard ECO fix for one or more hold time violations in a design (e.g., block 182). After the fixes have been applied, the design may be rechecked for unfixed and new violations relative to predetermined limits (e.g., block 184). If an unacceptable number of the remaining violations exceed an associated limit (e.g., the NO branch of decision block 184), existing ECOs may be modified and/or new ECOs may be generated to correct the violations (e.g., block 185).

If an acceptable number of the remaining violations are within defined limits (e.g., the YES branch of decision block 184), the new ECO cells of the present invention may be applied to fix the remaining violations (e.g., block 186). Applying the new cells generally includes placement of the new cells along existing nets (e.g., block 188). Routing of the existing nets may then be closed to account for the new cells (e.g., block 190).

The design may be rechecked against the design rules to determine if any of the corrected nets have too much (e.g., block 192) or too little (e.g., block 194) delay. If the corrected delay is proper (e.g., the no branch of decision block 192 and the YES branch of decision block 194), checking may continue as normal (e.g., block 196). If the corrected delay should be shortened (e.g., the YES branch of decision block 192), routing for the associated net may be reconnected to a faster input pin of the new cell (e.g., block 198). If the corrected delay should be longer (e.g., the NO branch of decision block 194), the associated net may be rerouted to a slower input pin of the new cell (e.g., block 200).

Figure 9:
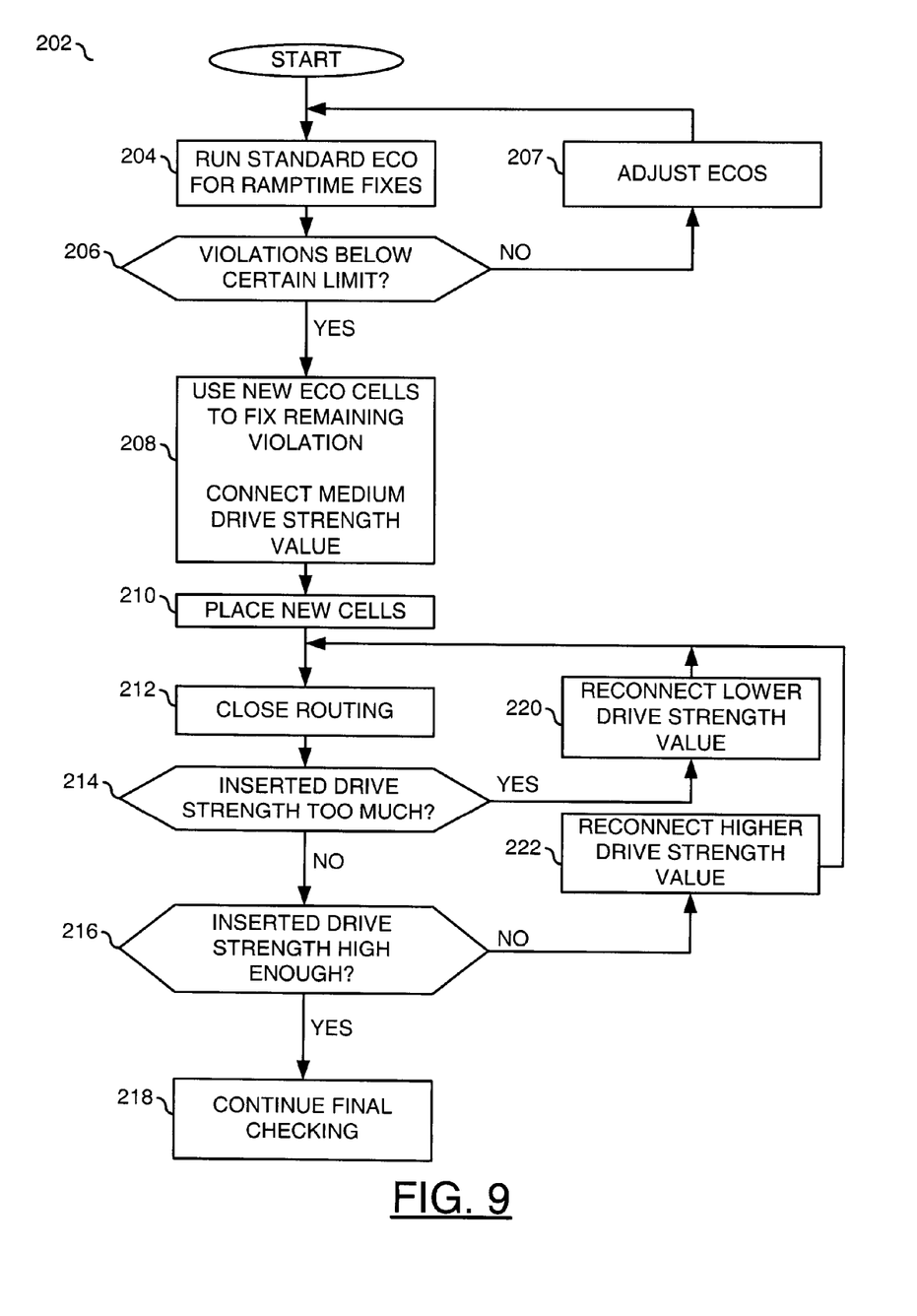
FIG. 9 is a flow diagram for an example method for correcting ramp time violations.

Referring to FIG. 9, a flow diagram for an example method 202 for correcting ramp time violations is shown. The method 202 generally begins with performing a standard ECO fix for one or more ramp time violations in a design (e.g., block 204). After the fixes have been applied, the design may be rechecked for unfixed and new violations relative to predetermined limits (e.g., block 206). If an unacceptable number of the remaining violations exceed an associated limit (e.g., the NO branch of decision block 206), existing ECOs may be modified and/or new ECOs may be generated to correct the violations (e.g., block 207).

If an acceptable number of the remaining violations are within defined limits (e.g., the YES branch of decision block 206), the new ECO cells of the present invention may be applied to fix the remaining violations (e.g., block 208). Applying the new cells generally includes placement of the new cells along existing nets (e.g., block 210). Routing of the existing nets may then be closed to account for the new cells (e.g., block 212).

The design may be rechecked against the design rules to determine if any of the corrected nets have too much (e.g., block 214) or too little (e.g., block 216) drive strength. If the corrected drive strength is proper (e.g., the NO branch of decision block 214 and the YES branch of decision block 216), checking may continue as normal (e.g., block 218). If the corrected drive strength should be reduced (e.g., the YES branch of decision block 214), routing for the associated net may be reconnected to a weaker output pin of the new cell (e.g., block 220). If the corrected drive strength should be stronger (e.g., the NO branch of decision block 216), the associated net may be rerouted to a stronger output pin of the new cell (e.g., block 222).

The function performed by the flow diagrams of FIGS. 8 and 9 may be implemented using a conventional general purpose digital computer programmed according to the teachings of the present specification, as will be apparent to those skilled in the relevant art (s). Appropriate software coding may readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which may be used to program a computer to perform a process in accordance with the present invention. The storage medium may include, but is not limited to, any type of disk including floppy disk, optical disk, CD-ROM, magneto-optical disks, ROMs, RAMs, EPROMs, EEPROMs, Flash memory, magnetic or optical cards, or any type of media suitable for storing electronic instructions.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation. Additionally, inverters may be added to change a particular polarity of the signals.

While the invention has been particularly shown and described with reference to the preferred embodiments thereof, it will be understood by those skilled in the art that various changes in form and details may be made without departing from the spirit and scope of the invention.

The invention claimed is:

1. A method for correcting a plurality of violations in a circuit design, comprising the steps of:
    (A) implementing a first engineering change order in said circuit design to correct a first of said violations;
    (B) implementing a second engineering change order with a special cell to correct a second of said violations, said second engineering change order being independent of said first engineering change order, said special cell (i) replacing a current cell in a layout of said circuit design associated with said second violation such that said current cell is physically removed from said layout, (ii) comprising at least three interfaces at a boundary of said special cell and available for a signal path associated with said second violation, all of said interfaces sharing a characteristic appropriate to correct said second violation, each of said interfaces having a different one of at least three different performances of said characteristic and said interfaces being one of (a) at least three inputs into said special cell and (b) at least three outputs out of said special cell and (iii) has a same logical operation as said current cell; and
    (C) routing, via a computer, said signal path to only one of said interfaces to fix said second violation.

2. The method according to claim 1, wherein step (C) comprises the sub-step of:
    connecting said signal path to a given one of said interfaces of said special cell associated with a middle of said different performances.

3. The method according to claim 2, further comprising the step of:
    evaluating said second violation with said signal path connected to said given interface.

4. The method according to claim 3, further comprising the step of:
    reconnecting said signal path from said given interface to another of said interfaces of said special cell to change said performance characteristic in response to said evaluating concluding that said second violation remains.

5. The method according to claim 1, further comprising the step of:
    evaluating said first violation with said first engineering change order implemented in said circuit design prior to implementing said second engineering change order.

6. The method according to claim 5, further comprising the steps of:
    modifying said first engineering change order; and
    repeating step (A) with said first engineering change order as modified until said first violation is corrected to within a predetermined limit.

7. The method according to claim 1, wherein (i) said interfaces of said special cell comprise said at least three inputs and (ii) said different performances of said characteristic comprise at least three different propagation delays.

8. The method according to claim 1, wherein (i) said interfaces of said special cell comprise said at least three outputs and (ii) said different performances of said characteristic comprise at least three propagation delays.

9. The method according to claim 1, wherein (i) said interfaces of said special cell comprise said at least three outputs and (ii) said different performances of said characteristic comprise at least three different ramp times.

10. The method according to claim 1, further comprising a storage medium storing a computer program comprising the steps (A) through (C).

11. A method for correcting a plurality of violations in a circuit design, comprising the steps of:
    (A) implementing a first engineering change order in said circuit design to correct a first of said violations;
    (B) implementing a second engineering change order by physically adding a special cell to a layout of said circuit design to correct a second of said violations, said special cell (i) being connected directly to a current cell associated with said second violation and (ii) comprising at least three interfaces at a boundary of said special cell and available for a signal path associated with said second violation, all of said interfaces sharing a characteristic appropriate to correct said second violation, each of said interfaces having a different one of at least three different performances of said characteristic and said interfaces being one of (a) at least three inputs into said special cell and (b) at least three outputs out of said special cell; and (C) routing, via a computer, said signal path to only one of said interfaces to fix said second violation.

12. The method according to claim 11, wherein step (C) comprises the substep of:

connecting said signal path to a given one of said interfaces of said special cell associated with a middle of said different performances.

13. The method according to claim 12, further comprising the step of:

evaluating said second violation with said signal path connected to said given interface.

14. The method according to claim 13, further comprising the step of:

reconnecting said signal path from said given interface to another of said interfaces of said special cell to change said performance characteristic in response to said evaluating concluding that said second violation remains.

15. The method according to claim 11, further comprising the step of:

evaluating said first violation with said first engineering change order implemented in said circuit design prior to implementing said second engineering change order.

16. The method according to claim 15, further comprising the steps of:

modifying said first engineering change order; and repeating step (A) with said first engineering change order as modified until said first violation is corrected to within a predetermined limit.

17. The method according to claim 11, wherein (i) said interfaces of said special cell comprise said at least three inputs, (ii) said different performances of said characteristic comprise at least three different propagation delays and (iii) an output of said special cell is directly connected to a current input of said current cell associated with said signal path.

18. The method according to claim 11, wherein (i) said interfaces of said special cell comprise said at least three outputs, (ii) said different performances of said characteristic comprise at least three different propagation delays and (iii) an input of said special cell is directly connected to a current output of said current cell associated with said signal path.

19. The method according to claim 11, wherein (i) said interfaces of said special cell comprise said at least three outputs, (ii) said different performances of said characteristic comprise at least three different ramp times and (iii) an input of said special cell is directly connected to a current output of said current cell associated with said signal path.

20. The method according to claim 11, further comprising a storage medium storing a computer program comprising the steps (A) through (C).

\* \* \* \* \*